US012690298B2

(12) United States Patent
Zhang et al.

(10) Patent No.: US 12,690,298 B2
(45) Date of Patent: Jul. 21, 2026

(54) LIGHT-EMITTING DEVICE AND METHOD FOR MANUFACTURING THE SAME

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 470 days.

(21) Appl. No.: 18/319,471

(22) Filed: May 17, 2023

(65) Prior Publication Data

US 2024/0213404 A1 Jun. 27, 2024

(30) Foreign Application Priority Data

Dec. 23, 2022 (CN) .......................... 202211666760.7

(51) Int. Cl.
| | |
|---|---|
| *H10H 20/818* | (2025.01) |
| *H10H 20/812* | (2025.01) |
| *H10H 20/833* | (2025.01) |
| *H10H 20/851* | (2025.01) |
| *H10H 20/856* | (2025.01) |
| *H10H 29/14* | (2025.01) |

(52) U.S. Cl.
CPC ........ *H10H 20/818* (2025.01); *H10H 20/812* (2025.01); *H10H 20/833* (2025.01); *H10H 20/8512* (2025.01); *H10H 20/856* (2025.01)

(58) Field of Classification Search
CPC .. H10H 20/818; H10H 20/812; H10H 20/856; H10H 20/0361; H10H 20/0362; H10H 20/833
See application file for complete search history.

(56) References Cited

U.S. PATENT DOCUMENTS

| | | | | |
|---|---|---|---|---|
| 3,998,673 | A | * 12/1976 | Chow | H01L 21/02532 148/DIG. 37 |
| 10,886,427 | B2 | * 1/2021 | Dupont | H10H 20/821 |

(Continued)

FOREIGN PATENT DOCUMENTS

| | | | | |
|---|---|---|---|---|
| CN | 101615647 | A | * 12/2009 | ....... H10H 20/01335 |
| CN | 101615647 | B | 4/2012 | |

(Continued)

*Primary Examiner* — Monica D Harrison
*Assistant Examiner* — Jacob T Nelson
(74) *Attorney, Agent, or Firm* — Carroll, Hoette & Butscher, LLC; Christopher R. Carroll

(57) ABSTRACT

A light-emitting device and a method for manufacturing a light-emitting device are provided. The light-emitting device includes: a substrate, provided with at least one light guide channel through the substrate, wherein each of the at least one light guide channel comprises a first opening and a second opening opposite to the first opening, an area of a section of the second opening is greater than an area of a section of the first opening, the substrate comprises a first substrate and a second substrate stacked, and the second substrate is configured to control a direction of light output through the light guide channel; and a light-emitting structure, provided at a side of the substrate where the first opening is located, wherein the light-emitting structure comprises at least one light-emitting unit, each of the at least one light guide channel corresponds to at least one light-emitting unit.

19 Claims, 5 Drawing Sheets

(56)　　　　　References Cited

U.S. PATENT DOCUMENTS

| | | | |
|---|---|---|---|
| 2017/0092485 A1* | 3/2017 | Brueck | .............. H10H 20/0137 |
| 2017/0338277 A1* | 11/2017 | Banna | ................. H10H 20/815 |
| 2021/0083152 A1* | 3/2021 | Biebersdorf | ....... H10H 20/8514 |

FOREIGN PATENT DOCUMENTS

| | | | | |
|---|---|---|---|---|
| CN | 109065681 | A | 12/2018 | |
| CN | 109950386 | B | 11/2020 | |
| CN | 109904292 | B | 5/2021 | |
| WO | WO-2020000184 | A1 * | 1/2020 | ......... H10H 20/8512 |

* cited by examiner

LIGHT-EMITTING DEVICE AND METHOD FOR MANUFACTURING THE SAME

CROSS REFERENCE TO RELATED APPLICATIONS

This application claims priority to Chinese Patent Application No. 202211666760.7, filed on Dec. 23, 2022, the entire content of which is incorporated herein by reference.

TECHNICAL FIELD

The present disclosure relates to the field of semiconductors, in particular to a light-emitting device and a method for manufacturing a light-emitting device.

BACKGROUND

Compared with a traditional light-emitting diode (LED) display technology, a LED micro-display technology is simple in design, such that the volume and weight of the overall system can be reduced, and the manufacturing cost can be reduced. Furthermore, the LED micro-display technology have the advantages of low power consumption, high light energy utilization, fast response speed, wide working temperature range, and strong anti-interference ability.

However, there are still some technical difficulties in the LED micro-display technology. For example, for LED micro-display, in order to improve the pixel, the distance between the respective light-emitting units is very small, and the angle of the emitted light is very large, as a result, it is easy to cause crosstalk between the light emitted by the light-emitting units.

SUMMARY

In view of this, the present disclosure provides a light-emitting device and a method for manufacturing a light-emitting device, to effectively reduce the crosstalk of the light-emitting device.

According to a first aspect of the present disclosure, a light-emitting device is provided. The light-emitting device includes: a substrate, provided with at least one light guide channel through the substrate, where each of the at least one light guide channel includes a first opening and a second opening opposite to the first opening, an area of a section of the second opening is greater than an area of a section of the first opening, the substrate includes a first substrate and a second substrate stacked, and the second substrate is configured to control a direction of light output through the light guide channel; and a light-emitting structure, provided at a side of the substrate where the first opening is located, where the light-emitting structure includes at least one light-emitting unit, each of the at least one light guide channel corresponds to at least one light-emitting unit.

In an embodiment, a material of the first substrate includes any of sapphire, silicon carbide, aluminum nitride and monocrystalline silicon with [111] crystal orientation.

In an embodiment, the substrate is a silicon-on-insulator (SOI) composite substrate.

In an embodiment, a material of the second substrate includes monocrystalline silicon with [100] crystal orientation, the light guide channel includes a light diffusion channel located in the second substrate, the light diffusion channel includes a first side, a second side opposite to the first side, a third side and a fourth side opposite to the third side, and the first side, the second side, the third side and the fourth side all have [111] crystal orientation.

In an embodiment, a distance between the first side and the second side gradually increases in a first direction, and a distance between the third side and the fourth side gradually increases in the first direction, where the first direction is a direction from the first opening to the second opening.

In an embodiment, a section of the light diffusion channel parallel to the substrate is rectangular.

In an embodiment, a material of the second substrate includes monocrystalline silicon with [110] crystal orientation, the light guide channel includes a light diffusion channel located in the second substrate, the light diffusion channel includes a fifth side, a sixth side opposite to the fifth side, a seventh side and an eighth side opposite to the seventh side, and the fifth side, the sixth side, the seventh side and the eighth side all have [111] crystal orientation.

In an embodiment, the fifth side and the sixth side are parallel to each other, and a distance between the seventh side and the eighth side gradually increases in a first direction, where the first direction is a direction from the first opening to the second opening.

In an embodiment, the light-emitting structure includes a first semiconductor layer, an active layer and a second semiconductor layer sequentially stacked, and the first semiconductor layer is disposed at a side of the substrate where the first opening is located; each of the at least one light-emitting unit includes a first electrode and a second electrode, the first semiconductor layer is electrically connected to the driving substrate through the first electrode, and the second semiconductor layer is electrically connected to the driving substrate through the second electrode.

In an embodiment, a first reflective layer is provided at a side of the second semiconductor layer away from the active layer.

In an embodiment, a transparent conductive layer is provided between the second semiconductor layer and the first reflective layer.

In an embodiment, the active layer includes a quantum well structure, the quantum well structure includes a first light-emitting layer and a second light-emitting layer, and a wavelength of a light emitted from the first light-emitting layer is different from a wavelength of a light emitted from the second light-emitting layer.

In an embodiment, a wavelength conversion medium layer is formed in the light guide channel, and the wavelength conversion medium layer includes quantum dots or phosphor.

In an embodiment, the light-emitting structure includes a plurality of light-emitting units, and an isolation member is provided between adjacent light-emitting units.

In an embodiment, the light-emitting device further includes a second reflective layer, which is located on a side wall of the light guide channel.

According to a second aspect of the present disclosure, a method for manufacturing a light-emitting device is provided. The method includes: providing a substrate, where the substrate includes a first substrate and a second substrate stacked; forming a light-emitting structure on the substrate, where the light-emitting structure includes at least one light-emitting unit; and etching the substrate to form at least one light guide channel penetrated through the first substrate and the second substrate, where the second substrate is configured to control a direction of light output through the light guide channel, each of the at least one light guide channel corresponds to at least one light-emitting unit, each of the at least one light guide channel includes a first opening and a second opening opposite to the first opening, and an area of a section of the second opening is greater than an area of a section of the first opening.

In an embodiment, a material of the second substrate includes monocrystalline silicon with [100] crystal orientation, and etching the substrate to form at least one light guide channel penetrated through the first substrate and the second substrate includes: etching the second substrate to form a light diffusion channel in the second substrate, where the light diffusion channel includes a first side, a second side opposite to the first side, a third side and a fourth side opposite to the third side, a distance between the first side and the second side gradually increases in a first direction, and a distance between the third side and the fourth side gradually increases in the first direction, where the first direction is a direction from the first opening to the second opening, and the first side, the second side, the third side and the fourth side all have [111] crystal orientation; and etching the first substrate to form a first channel penetrated through the first substrate, so as to form the light guide channel by the first channel and the light diffusion channel.

In the embodiments, a material of the second substrate includes monocrystalline silicon with [110] crystal orientation, and etching the substrate to form at least one light guide channel penetrated through the first substrate and the second substrate includes: etching the second substrate to form a light diffusion channel in the second substrate, where the light diffusion channel includes a fifth side, a sixth side opposite to the fifth side, a seventh side and an eighth side opposite to the seventh side, the fifth side and the sixth side are parallel to each other, and a distance between the seventh side and the eighth side gradually increases in a first direction, where the first direction is a direction from the first opening to the second opening, and the fifth side, the sixth side, the seventh side and the eighth side all have [111] crystal orientation; and etching the first substrate to form a first channel penetrated through the first substrate, so as to form the light guide channel by the first channel and the light diffusion channel.

In an embodiment, forming a light-emitting structure on the substrate includes: sequentially growing a first semiconductor layer, an active layer and a second semiconductor layer on the first substrate; and forming a first electrode and a second electrode, such that the first semiconductor layer is electrically connected to the driving substrate through the first electrode, and the second semiconductor layer is electrically connected to the driving substrate through the second electrode.

In an embodiment, the method further includes: forming a wavelength conversion medium layer in the light guide channel, where the wavelength conversion medium layer includes quantum dots or phosphor.

Figure 1:
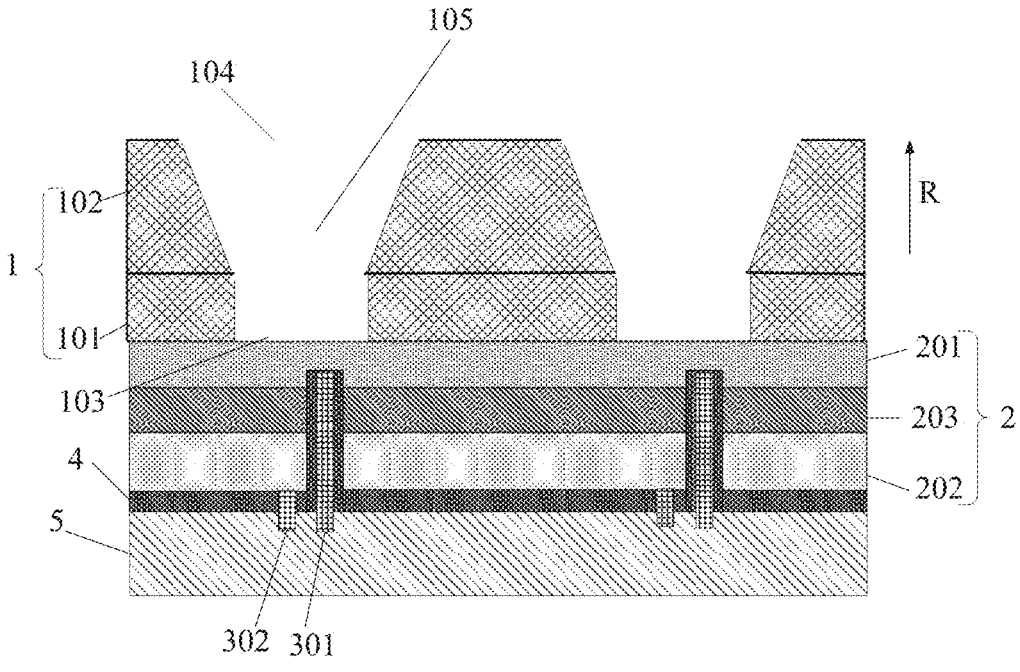
FIG. 1 is a schematic diagram illustrating a light-emitting device according to an embodiment of the present disclosure.

For the convenience of understanding of the present disclosure, all reference numerals appearing in the present disclosure are listed below:

substrate 1; first substrate 101; second substrate 102; first opening 103; second opening 104; light guide channel 105; first side 1051; second side 1052; third side 1053; fourth side 1054; fifth side 1055; sixth side 1056; seventh side 1057; eighth side 1058; third substrate 106; light-emitting structure 2; first semiconductor layer 201; second semiconductor layer 202; active layer 203; first electrode 301; second electrode 302; insulation layer 4; driving substrate 5; first reflective layer 6; transparent conductive layer 7; second reflective layer 8; wavelength conversion medium layer 9; first light-emitting layer 2031; second light-emitting layer 2032; isolation member 10.

DETAILED DESCRIPTION

Exemplary embodiments will be described in detail herein, examples of which are represented in the drawings. Where the following description relates to the accompanying drawings, the same numerals in the different drawings indicate the same or similar elements unless otherwise indicated. The embodiments described in the following exemplary embodiments do not represent all embodiments that are consistent with the present disclosure. Rather, they are only examples of devices that are consistent with some aspects of the present disclosure, as detailed in the appended claims The terms used in the present disclosure are solely for the purpose of describing specific embodiments and are not intended to limit the present disclosure. The terms "first", "second", and similar terms used in the description and claims of the present disclosure do not indicate any of order, quantity, and importance, but are only used to distinguish different components. Similarly, the wordings such as "a" or "an" do not indicate a quantitative limitation, but rather indicate the existence of at least one.

Figure 2:
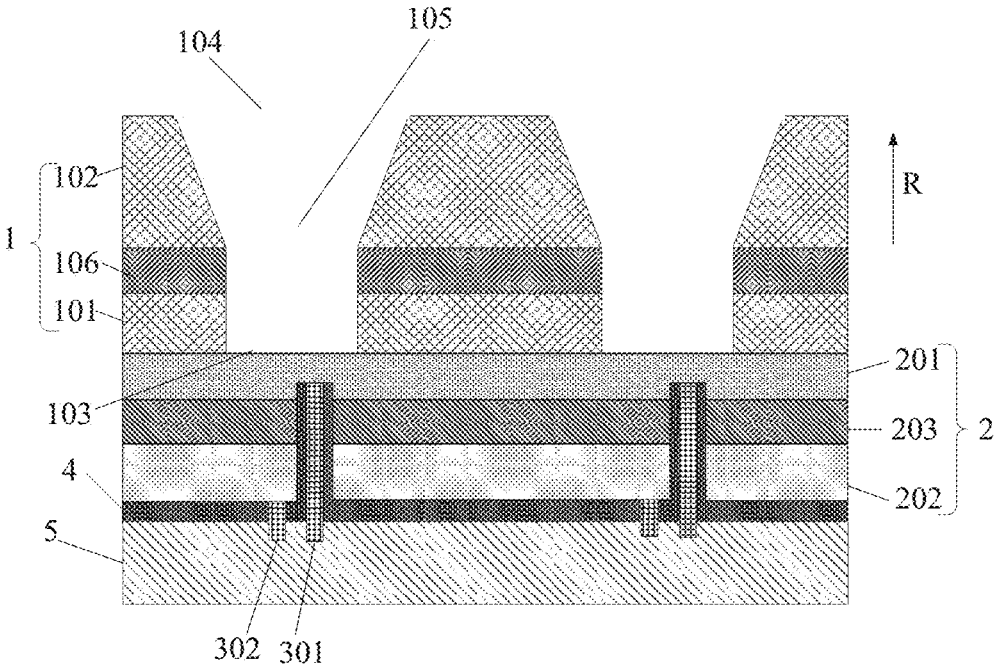
FIG. 2 is a schematic diagram illustrating a light-emitting device according to another embodiment of the present disclosure.

As shown in FIGS. 1 to 2, FIG. 1 is a schematic diagram illustrating a light-emitting device according to an embodiment of the present disclosure, and FIG. 2 is a schematic diagram illustrating a light-emitting device according to another embodiment of the present disclosure. The light-emitting device provided by the embodiments of the present disclosure includes: a substrate 1, provided with at least one light guide channel 105 penetrated through the substrate 1, where each of the at least one light guide channel 105 includes a first opening 103 and a second opening 104 opposite to the first opening 103, an area of a section of the second opening 104 is greater than an area of a section of the first opening 103, the substrate 1 includes a first substrate 101 and a second substrate 102 stacked on the first substrate 101, and the second substrate 102 is configured to control a direction of light output through the light guide channel 105; and a light-emitting structure 2, provided at a side of the substrate 1 where the first opening 103 is located, where the light-emitting structure 2 includes at least one light-emitting unit, each of the at least one light guide channel 105 corresponds to at least one light-emitting unit.

In the embodiments, the light guide channel 105 controlling the direction of the emitted light is formed by etching the substrate 1, such that the light emitted from each light-emitting unit is uniform and well-directed, and the light extraction rate is high, thereby the crosstalk between the light emitted by light-emitting units is avoided. The light guide channel 105 includes a light diffusion channel located in the second substrate 102, and an area of a section of the second opening 104 of the light diffusion channel is greater than an area of a section of the first opening 103, and the light diffusion channel can be configured to control a direction of light output through the light guide channel 105.

In some embodiments, the material of the first substrate 101 includes any of sapphire, silicon carbide, aluminum nitride and monocrystalline silicon with [111] crystal orientation.

In the embodiments of the present disclosure, the substrate 1 includes at least two layers, i.e., the first substrate 101 and the second substrate 102. The first substrate 101 serves as a growth substrate and is configured to grow the light-emitting structure 2. The second substrate 102 is configured to manufacture the light guide channel 105 by etching. Depending on the reactivity of the etching solution to the material with different crystal orientations of the second substrate 102, the light diffusion channel with a large sectional area of the second opening 104 is formed by etching, and the light diffusion channel can control the direction of light output through the light guide channel 105.

In the embodiment shown in FIG. 1, the substrate 1 includes a first substrate 101 and a second substrate 102.

In the embodiment shown in FIG. 2, the substrate 1 includes the first substrate 101, the second substrate 102, and a third substrate 106 disposed between the first substrate 101 and the second substrate 102. For example, the third substrate 106 is a SiO$_2$ layer, and the first substrate 101 and the second substrate 102 are Si layers, such that substrate 1 is formed as a SOI composite substrate.

Figure 3:
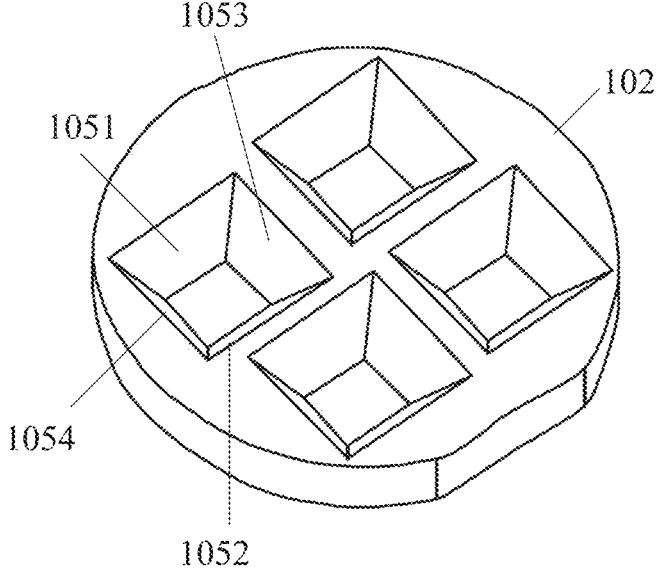
FIG. 3 is a schematic diagram illustrating a second substrate according to an embodiment of the present disclosure, where a material of the second substrate includes monocrystalline silicon with [100] crystal orientation.

As shown FIG. 3, FIG. 3 is a schematic diagram illustrating a second substrate according to an embodiment of the present disclosure, where a material of the second substrate 102 includes monocrystalline silicon with [100] crystal orientation. The light guide channel 105 includes a light diffusion channel located in the second substrate 102, the light diffusion channel includes a first side 1051, a second side 1052 opposite to the first side 1051, a third side 1053 and a fourth side 1054 opposite to the third side 1053, and the first side 1051, the second side 1052, the third side 1053 and the fourth side 1054 all have [111] crystal orientation.

In this embodiment, a section of the light diffusion channel parallel to the substrate 1 is rectangular.

In this embodiment, a distance between the first side 1051 and the second side 1052 gradually increases in a first direction R, and a distance between the third side 1053 and the fourth side 1054 gradually increases in the first direction R, where the first direction R is a direction from the first opening 103 to the second opening 104.

A first channel is formed in the first substrate 101, and in this embodiment, the inner diameter of the first channel is constant in the first direction R, for example, the contour shape of the first channel may be a cylinder or a cuboid. In some embodiments, the inner diameter of the first channel may be variable, for example, the inner diameter of the first channel gradually increases in the first direction R.

A light diffusion channel connected to the first channel is formed in the second substrate 102, and the light diffusion channel is configured to control the direction of the emitted light. In this embodiment, the inner diameter of the light diffusion channel gradually increases in the first direction R. For example, the contour shape of the light diffusion channel may be a square frustum. That is, the distance between the first side 1051 and the second side 1052 gradually increases in the first direction R, and the distance between the third side 1053 and the fourth side 1054 gradually increases in the first direction R, thus the light is allowed to diffuse on all sides.

Figure 4:
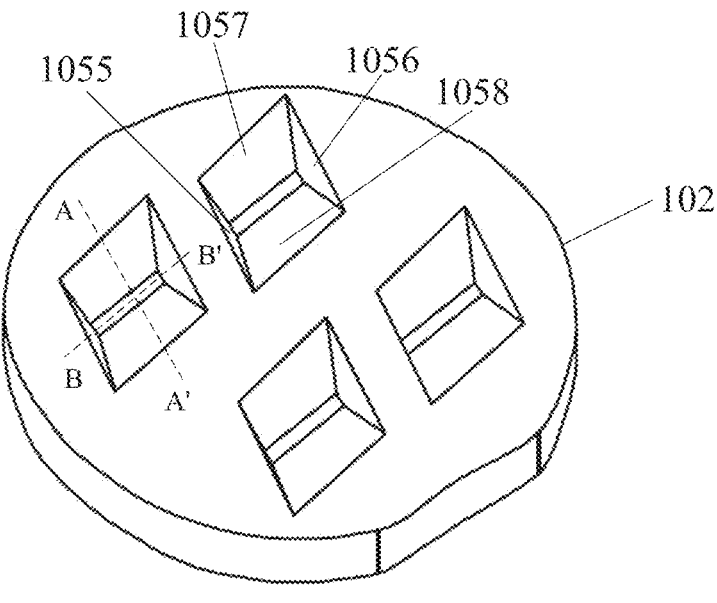
FIG. 4 is a schematic diagram illustrating a second substrate according to another embodiment of the present disclosure, where a material of the second substrate includes monocrystalline silicon with [110] crystal orientation.

As shown FIG. 4, FIG. 4 is a schematic diagram illustrating a second substrate according to another embodiment of the present disclosure, where a material of the second substrate includes monocrystalline silicon with [110] crystal orientation. The light guide channel 105 includes a light diffusion channel located in the second substrate 102, the light diffusion channel includes a fifth side 1055, a sixth side 1056 opposite to the fifth side 1055, a seventh side 1057 and an eighth side 1058 opposite to the seventh side 1057, and the fifth side 1055, the sixth side 1056, the seventh side 1057 and the eighth side 1058 all have [111] crystal orientation.

It is to be noted that FIGS. 3 and 4 illustrate two arrangements of the light guide channels, and the present disclosure does not limit the arrangement of the light-emitting structure or the light-guiding channels.

In some embodiments, the fifth side 1055 and the sixth side 1056 are parallel to each other, and a distance between the seventh side 1057 and the eighth side 1058 gradually increases in the first direction R, where the first direction R is a direction from the first opening 103 to the second opening 104.

Figure 5:
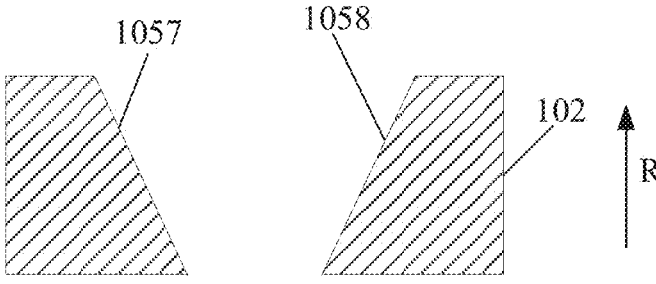
FIG. 5 is a sectional view taken along line AA' in FIG. 4.
Figure 6:
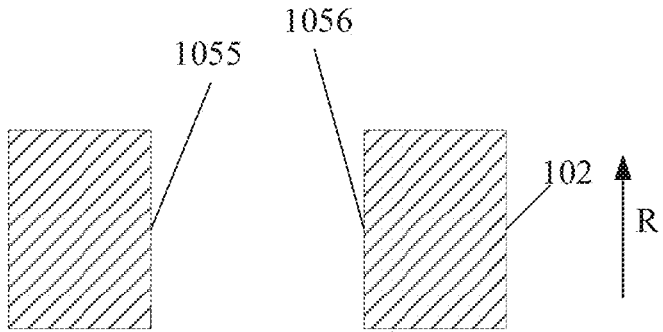
FIG. 6 is a sectional view taken along line BB' in FIG. 4.

On the second substrate 102, the seventh side 1057 and the eighth side 1058 formed by etching in the <110> direction are inclined (as shown in FIG. 5 obtained by taking along line AA' of FIG. 4), and the fifth side 1055 and the sixth side 1056 formed by etching in the <112> direction are vertical faces perpendicular to the second substrate 102 (as shown in FIG. 6 obtained by taking along line BB' of FIG. 4), so that light diffusion occurs only along the seventh side 1057 and the eighth side 1058, and the light output along the fifth side 1055 and the sixth side 1056 is collimated, so that the shape of the light diffusion channel can be controlled by the crystal direction, and the direction of light emitted from the light-emitting device can be controlled.

Figure 7:
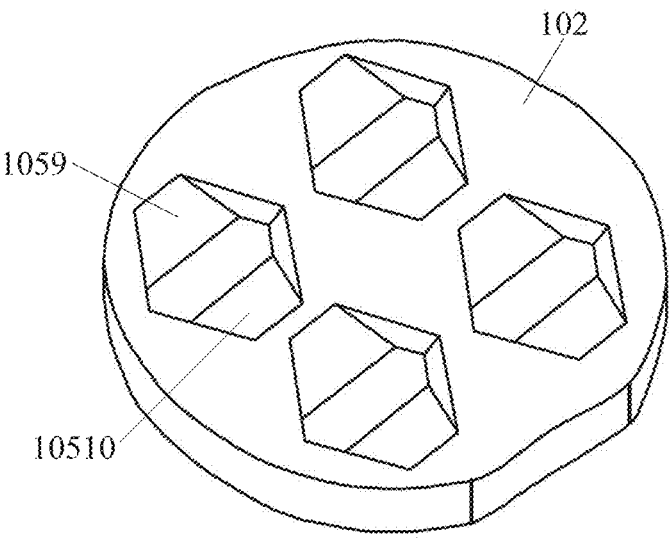
FIG. 7 is a schematic diagram illustrating a second substrate according to yet another embodiment of the present disclosure, where the light diffusion channel has six sides.

FIG. 7 is a schematic diagram illustrating a second substrate according to yet another embodiment of the present disclosure, where the light diffusion channel has six sides. In the embodiment shown in FIG. 7, the light diffusion channel in the second substrate 102 has six sides, where a distance between two opposing sides (a ninth side 1059 and a tenth side 10510) of the six sides gradually increases in the first direction R. That is, the ninth side 1059 and the tenth side 10510 are inclined faces. The remaining four sides may be vertical faces. In some embodiments, when the light diffusion channel includes six sides, two pairs of sides (opposite each other) are inclined faces, and one pair of sides (opposite each other) is vertical, or one pairs of sides (opposite each other) are inclined faces, and two pair of sides (opposite each other) is vertical.

In the embodiments shown in FIGS. 1 and 2, the light-emitting structure 2 includes a first semiconductor layer 201, an active layer 203 and a second semiconductor layer 202 sequentially stacked, and the first semiconductor layer 201 is disposed on a side of the substrate 1 where the first opening 103 is located. Each light-emitting unit of the light-emitting structure 2 includes a first electrode 301 and a second electrode 302, the first semiconductor layer 201 is electrically connected to the driving substrate 5 through the first electrode 301, and the second semiconductor layer 202 is electrically connected to the driving substrate 5 through the second electrode 302. In some embodiments, other semiconductor layers, such as a buffer layer and a nucleation layer, can be provided between the first semiconductor layer 201 and the substrate 1, and other semiconductor layers (such as a buffer layer and a nucleation layer) can be used to relieve the stress generated when growing the light-emitting structure 2 and improve the crystal structure of the light-emitting structure 2. It is to be noted that the driving substrate 5 may be a driving circuit board that includes a driving circuit.

In the embodiments shown in FIGS. 1 and 2, the light-emitting device further includes an insulation layer 4, which can isolate the light-emitting structure 2 from the external environment to protect the light-emitting structure 2.

Figure 8:
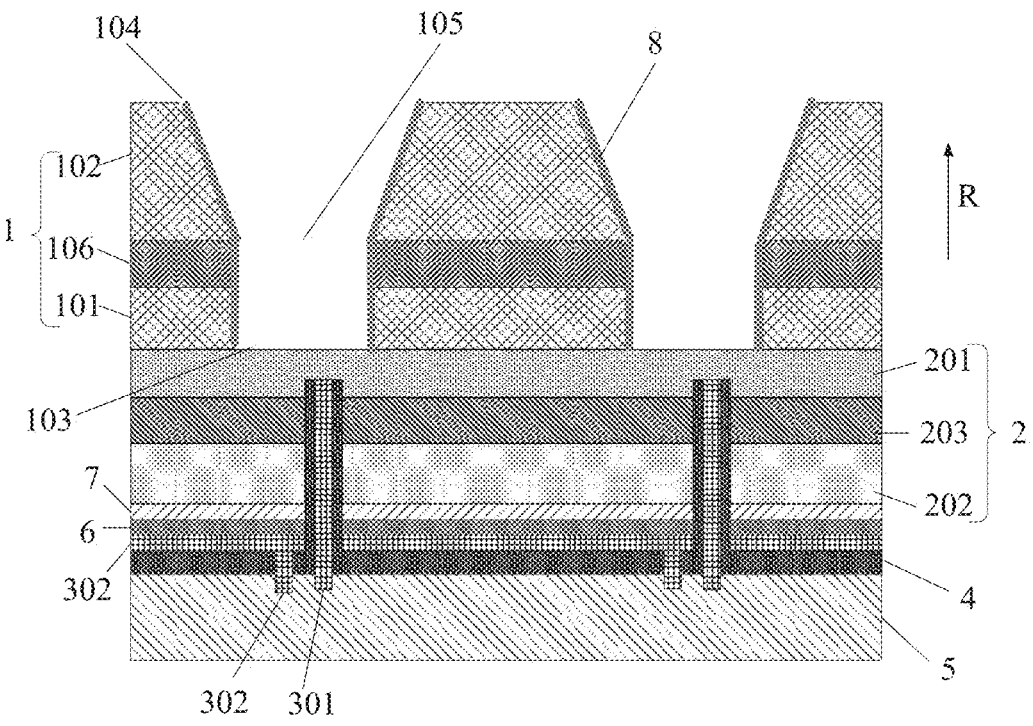
FIG. 8 is a schematic diagram illustrating a light-emitting device according to yet another embodiment of the present disclosure.

FIG. 8 is a schematic diagram illustrating a light-emitting device according to yet another embodiment of the present disclosure. As shown in FIG. 8, in this embodiment, a first reflective layer 6 is provided on a side of the second semiconductor layer 202 away from the active layer 203, and the first reflective layer 6 is configured to reflect the light emitted downward from the light-emitting structure 2, so that the light is emitted toward the side of the light guide channel 105. A material of the first reflective layer 6 includes a metallic conductive material.

In some embodiments, a transparent conductive layer 7 is provided between the second semiconductor layer 202 and the first reflective layer 6, and a material of the transparent conductive layer 7 includes indium tin oxide.

In some embodiments, as shown in FIG. 7, the light-emitting device further includes a second reflective layer 8, which is located on a side wall of the light-guiding channel 105. The second reflective layer 8 may be a metal reflector, a distributed Bragg reflector (DBR), or a photonic crystal.

Figure 9:
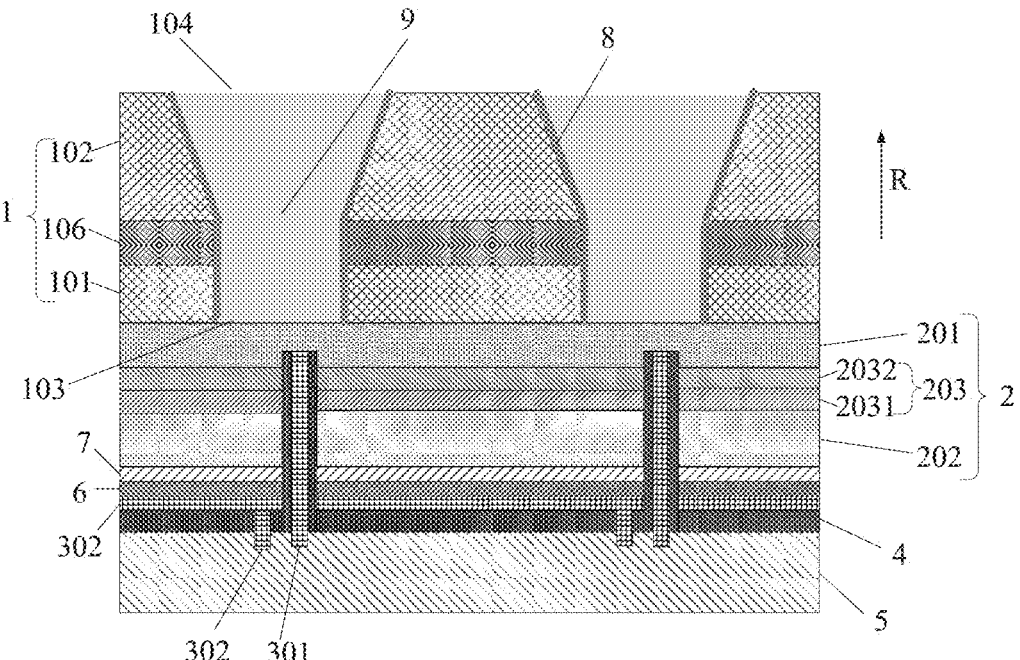
FIG. 9 is a schematic diagram illustrating a light-emitting device according to still another embodiment of the present disclosure.

FIG. 9 is a schematic diagram illustrating a light-emitting device according to still another embodiment of the present disclosure. As shown in FIG. 9, in this embodiment, the active layer 203 includes a quantum well structure, the quantum well structure includes a first light-emitting layer 2031 and a second light-emitting layer 2032, and a wavelength of a light emitted from the first light-emitting layer 2031 is different from a wavelength of a light emitted from the second light-emitting layer 2032, i.e., a colour of light emitted from the first light-emitting layer 2031 can be different from a colour of light emitted from the second light-emitting layer 2032.

The quantum well structure may be a single quantum well structure or a multiple quantum well structure, where the multiple quantum well may include one wavelength or multiple wavelengths, and the present disclosure is not limited thereto. In this embodiment, the first light-emitting layer 2031 emits green light, and the second light-emitting layer 2032 emits blue light. In some embodiments, as shown in FIG. 9, a wavelength conversion medium layer 9 is formed in the light guide channel 105, and the wavelength conversion medium layer 9 includes quantum dots or phosphor. The first light-emitting layer 2031 and the second light-emitting layer 2032 combined with the wavelength conversion medium layer 9 within the light guide channel 105 can cause the light-emitting device to emit white light or achieve full-colour display.

For example, in the embodiment shown in FIG. 1, the active layer 203 may be a quantum well structure which can emit light with a single colour. For example, in the embodiment shown in FIG. 1, a wavelength conversion medium layer 9 (not shown in FIG. 1) can be formed in the light guide channel 105, and the wavelength conversion medium layer 9 may include quantum dots, where the active layer 203 emits blue light, and the wavelength conversion medium layer 9 can include red quantum dots, green quantum dots, and colourless quantum dots, and the light-emitting device emits red light, green light, and blue light, respectively, to achieve full-colour display. For example, the wavelength conversion medium layer 9 includes phosphor, and the active layer 203 emits blue light, where the wavelength conversion medium layer 9 may include yellow phosphor, such that the light-emitting device emits white light.

Figure 10:
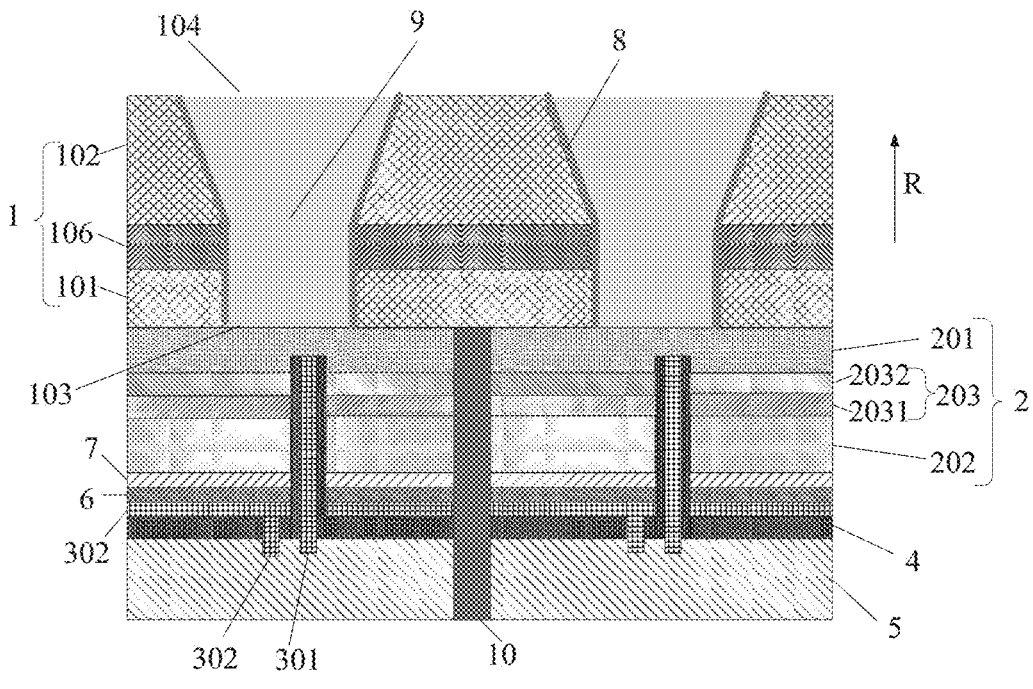
FIG. 10 is a schematic diagram illustrating a light-emitting device according to still another embodiment of the present disclosure.

FIG. 10 is a schematic diagram illustrating a light-emitting device according to still another embodiment of the present disclosure. As shown in FIG. 10, the light-emitting structure 2 includes a plurality of light-emitting units, and an isolation member 10 is provided between adjacent light-emitting units. The isolation member 10 is configured to isolate adjacent light-emitting units to avoid crosstalk of the light.

Figure 11:
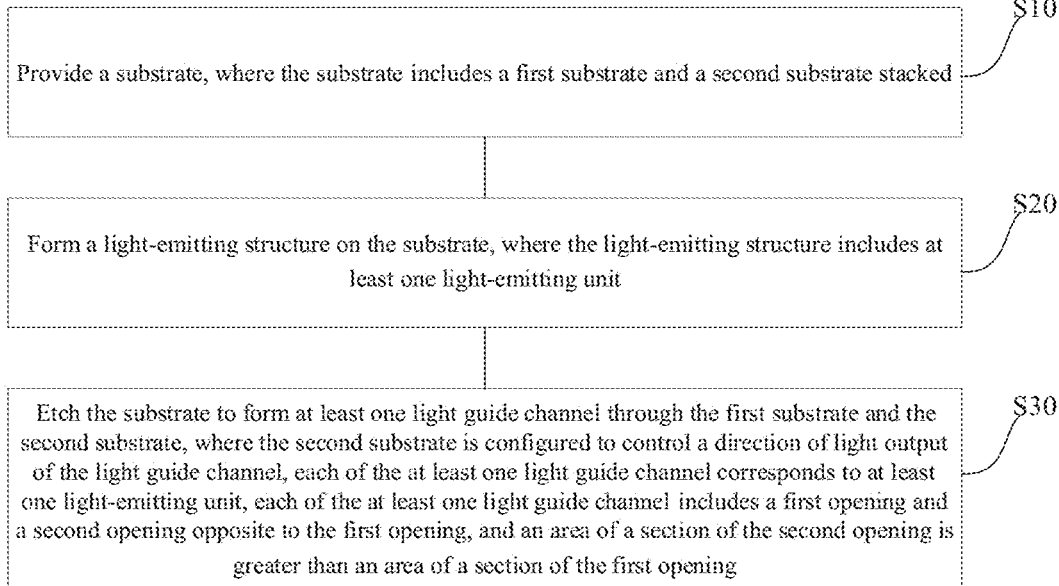
FIG. 11 is a flowchart illustrating a method for manufacturing a light-emitting device according to an embodiment of the present disclosure.

FIG. 11 is a flowchart illustrating a method for manufacturing a light-emitting device according to an embodiment of the present disclosure. As shown in FIG. 11, this embodiment provides a method for manufacturing a light-emitting device that can be used to manufacture the light-emitting device as shown in FIG. 1 or FIG. 2. The method includes the following steps S10 to S30.

At step S10, a substrate 1 is provided, where the substrate 1 includes a first substrate 101 and a second substrate 102 stacked.

At step S20, a light-emitting structure 2 is formed on the substrate 1, where the light-emitting structure 2 includes at least one light-emitting unit.

At step S30, the substrate 1 is etched to form at least one light guide channel 105 penetrated through the first substrate 101 and the second substrate 102, where the second substrate 12 is configured to control a direction of light output through the light guide channel 105, each of the at least one light guide channel 105 corresponds to at least one light-emitting unit, each of the at least one light guide channel 105 includes a first opening 103 and a second opening 104 opposite to the first opening 103, and an area of a section of the second opening 104 is greater than an area of a section of the first opening 103.

In this embodiment, by providing the light guide channel 105 the light emitted from each light-emitting unit is uniform and well-directed, and the light extraction rate is high, thereby the crosstalk between the light emitted by light-emitting units is avoided. The light guide channel 105 includes a light diffusion channel located in the second substrate 102, and an area of a section of the second opening 104 is greater than an area of a section of the first opening 103, and the light diffusion channel can control a direction of light output through the light guide channel 105.

In an embodiment, the substrate 1 formed in step S10 may include the first substrate 101 and the second substrate 102, as shown in FIG. 1.

In an embodiment, the substrate 1 formed in step S10 may include a first substrate 101, a second substrate 102, and a third substrate 106 disposed between the first substrate 101 and the second substrate 102, as shown in FIG. 2.

In some embodiments, in step S20, forming the light-emitting structure 2 on the substrate 1 includes: sequentially growing a first semiconductor layer 201, an active layer 203 and a second semiconductor layer 202 on the first substrate 101; and forming a first electrode 301 and a second electrode 302, such that the first semiconductor layer 201 is electrically connected to the driving substrate 5 through the first electrode 301, and the second semiconductor layer 202 is electrically connected to the driving substrate 5 through the second electrode 302.

Specifically, at least one electrode channel is formed, and the electrode channel extends through the second semiconductor layer 202 and the active layer 203 to extend into the first semiconductor layer 201. The first electrode 301 is formed in each electrode channel, the first electrode 301 is insulated from the second semiconductor layer 202 and the active layer 203, and the first semiconductor layer 201 is electrically connected to the driving substrate 5 through the first electrode 301. At least one second electrode 302 is formed on a side of the second semiconductor layer 202 away from the active layer 203, and the second semiconductor layer 202 is electrically connected to the driving substrate 5 through the second electrode 302.

The light guide channel 105 is formed by etching the second substrate 102, and depending on the reactivity of the etching solution to the material with different crystal orientations of the second substrate 102, the light diffusion channel with a large sectional area of the second opening 104 is formed by etching, and the light diffusion channel can control the direction of light output through the light guide channel 105.

In an embodiment, a material of the second substrate 102 includes monocrystalline silicon with [100] crystal orientation, and at step S30, etching the substrate 1 to form at least one light guide channel 105 through the first substrate 101 and the second substrate 102 includes: etching the second substrate 102 to form a light diffusion channel in the second substrate 102, where the light diffusion channel includes a first side 1051, a second side 1052 opposite to the first side 1051, a third side 1053 and a fourth side 1054 opposite to the third side 1053, a distance between the first side 1051 and the second side 1052 gradually increases in a first direction, and a distance between the third side and the fourth side gradually increases in the first direction R, where the first direction R is a direction from the first opening 103 to the second opening 104, and the first side 1051, the second side 1052, the third side 1053 and the fourth side 1054 all have [111] crystal orientation; and etching the first substrate 101 to form a first channel penetrated through the first substrate 101, so as to form the light guide channel 105 by the first channel and the light diffusion channel.

The first channel is formed in the first substrate 101, and in this embodiment, the inner diameter of the first channel is constant in the first direction R, for example, the contour shape of the first channel may be a cylinder or a cuboid. In some embodiments, the inner diameter of the first channel may be variable, for example, the inner diameter of the first channel gradually increases in the first direction R. For example, the first channel is formed by dry etching the first substrate 101.

The light diffusion channel connected to the first channel is formed in the second substrate 102, and the light diffusion channel is configured to control the direction of the emitted light. In this embodiment, the inner diameter of the light diffusion channel gradually increases in the first direction R. For example, the contour shape of the light diffusion channel may be a square frustum. That is, the distance between the first side 1051 and the second side 1052 gradually increases in the first direction R, and the distance between the third side 1053 and the fourth side 1054 gradually increases in the first direction R, thus the light is allowed to diffuse on all sides. For example, KOH solution can be used to etch the second substrate 102, and the KOH solution is highly reactive to the monocrystalline silicon with [100] crystal orientation compared to the monocrystalline silicon with [111] crystal orientation, thus a light diffusion channel with a gradually increasing inner diameter in the first direction R is formed. The sides of the light diffusion channel have [111] crystal orientation.

In an embodiment, a material of the second substrate 102 includes monocrystalline silicon with [110] crystal orientation, and at step S30, etching the substrate 1 to form at least one light guide channel 105 penetrated through the first substrate 101 and the second substrate 102 includes: etching the second substrate 102 to form a light diffusion channel in the second substrate 102, where the light diffusion channel includes a fifth side 1055, a sixth side 1056 opposite to the fifth side 1055, a seventh side 1057 and an eighth side 1058 opposite to the seventh side 1057, the fifth side 1055 and the sixth side 1056 are parallel to each other, and a distance between the seventh side 1057 and the eighth side 1058 gradually increases in a first direction R, where the first direction R is a direction from the first opening 103 to the second opening 104, and the fifth side 1055, the sixth side 1056, the seventh side 1057 and the eighth side 1058 all have [111] crystal orientation; and etching the first substrate 101 to form a first channel penetrated through the first substrate 101, so as to form the light guide channel by the first channel and the light diffusion channel.

Where, on the second substrate 102, the seventh side 1057 and the eighth side 1058 formed by etching in the <110> direction are inclined (as shown in FIG. 5 obtained by taking along line AA' of FIG. 4), and the fifth side 1055 and the sixth side 1056 formed by etching in the <112> direction are vertical faces perpendicular to the second substrate 102 (as shown in FIG. 6 obtained by taking along line BB' of FIG. 4), so that light diffusion occurs only along the seventh side 1057 and the eighth side 1058, and the light output along the fifth side 1055 and the sixth side 1056 is collimated. For example, the KOH solution can be used to etch the second substrate 102, and the KOH solution is highly reactive for the <110> direction of the monocrystalline silicon with [110] crystal orientation compared to the monocrystalline silicon with [111] crystal orientation, and in the <110> direction, the inner diameter of the light diffusion channel gradually increases in the first direction R. The KOH solution is highly reactive for the <112> direction of the monocrystalline silicon with [110] crystal orientation, and in the <112> direction, the sides of the light diffusion channel remain parallel, and the sides of the light diffusion channel have [111] crystal orientation. Therefore, the shape of the light diffusion channel can be controlled by the crystal direction, and the direction of light emitted from the light-emitting device can be controlled.

In some embodiments, the method further includes: forming a wavelength conversion medium layer 9 (as shown in FIG. 9) in the light guide channel 105, where the wavelength conversion medium layer 9 includes quantum dots or phosphor.

For example, the first light-emitting layer 2031 emits green light, and the second light-emitting layer 2032 emits blue light. In some embodiments, and the first light-emitting layer 2031 and the second light-emitting layer 2032 combined with the wavelength conversion medium layer 9 within the light guide channel 105 can cause the light-emitting device to emit white light or achieve full-colour display.

The semiconductor structure and the method for manufacturing the same provided by the present disclosure include at least the following beneficial effects.

The light guide channel controlling the direction of the emitted light emission is formed by etching the substrate, such that the light emitted from each light-emitting is uniform and well-directed, and the light extraction rate is high, thereby the crosstalk between the light emitted by light-emitting units is avoided.

The above are the embodiments of the present disclosure, and are not intended to limit the present disclosure. Any modifications, equivalent substitutions, improvements, etc. made within the spirit and principles of the present disclosure will be included within the scope of protection of the present disclosure.

What is claimed is:

1. A light-emitting device, comprising:
a substrate, provided with at least one light guide channel through the substrate, wherein each of the at least one light guide channel comprises a first opening and a second opening opposite to the first opening, an area of a section of the second opening is greater than an area of a section of the first opening, the substrate comprises a first substrate and a second substrate stacked, and the second substrate is configured to control a direction of light output through the light guide channel; and
a light-emitting structure, provided at a side of the substrate where the first opening is located, wherein the light-emitting structure comprises at least one light-emitting unit, each of the at least one light guide channel corresponds to at least one light-emitting unit;
wherein the first opening is located in the first substrate, and the second opening is located in the second substrate;
wherein a material of the first substrate comprises any of sapphire, silicon carbide, aluminum nitride and monocrystalline silicon with [111] crystal orientation; and a material of the second substrate comprises monocrystalline silicon with [100] crystal orientation or monocrystalline silicon with [110] crystal orientation; and
wherein the light guide channel comprises a first channel located in the first substrate and a light diffusion channel located in the second substrate.

2. The light-emitting device of claim 1, wherein the substrate is a silicon-on-insulator composite substrate.

3. The light-emitting device of claim 1, wherein the light diffusion channel includes a first side, a second side opposite to the first side, a third side and a fourth side opposite to the third side, and the first side, the second side, the third side and the fourth side all have [111] crystal orientation.

4. The light-emitting device of claim 3, wherein a first cross-section perpendicular to the first side and the second side in a first direction has a first trapezoidal shape, and a second cross-section perpendicular to the third side and the fourth side in the first direction has a second trapezoidal shape, wherein the first direction is a direction from the first opening to the second opening.

5. The light-emitting device of claim 3, wherein a section of the light diffusion channel parallel to the substrate is rectangular.

6. The light-emitting device of claim 1, wherein the light diffusion channel comprises a fifth side, a sixth side opposite to the fifth side, a seventh side and an eighth side opposite to the seventh side, and the fifth side, the sixth side, the seventh side and the eighth side all have [111] crystal orientation.

7. The light-emitting device of claim 6, wherein the fifth side and the sixth side are parallel to each other, and a cross-section perpendicular to the seventh side and the eighth side in a first direction has a trapezoidal shape, wherein the first direction is a direction from the first opening to the second opening.

8. The light-emitting device of claim 1, wherein
the light-emitting structure comprises a first semiconductor layer, an active layer and a second semiconductor layer sequentially stacked, and the first semiconductor layer is disposed at a side of the substrate where the first opening is located;
each of the at least one light-emitting unit comprises a first electrode and a second electrode, the first semiconductor layer is electrically connected to a driving substrate through the first electrode, and the second semiconductor layer is electrically connected to the driving substrate through the second electrode.

9. The light-emitting device of claim 8, further comprising: a first reflective layer provided at a side of the second semiconductor layer away from the active layer.

10. The light-emitting device of claim 9, further comprising: a transparent conductive layer provided between the second semiconductor layer and the first reflective layer.

11. The light-emitting device of claim 9, further comprising a second reflective layer, which is located on a side wall of the light guide channel.

12. The light-emitting device of claim 8, wherein the active layer comprises a quantum well structure, the quantum well structure comprises a first light-emitting layer and a second light-emitting layer, and a wavelength of a light emitted from the first light-emitting layer is different from a wavelength of a light emitted from the second light-emitting layer.

13. The light-emitting device of claim 1, further comprising: a wavelength conversion medium layer formed in the light guide channel, and the wavelength conversion medium layer comprises quantum dots or phosphor.

14. The light-emitting device of claim 1, wherein the light-emitting structure comprises a plurality of light-emitting units, and the light-emitting device further comprises an isolation member provided between adjacent light-emitting units.

15. A method for manufacturing a light-emitting device, comprising:
providing a substrate, wherein the substrate comprises a first substrate and a second substrate stacked;
forming a light-emitting structure on the substrate, wherein the light-emitting structure comprises at least one light-emitting unit; and
etching the substrate to form at least one light guide channel penetrated through the first substrate and the second substrate, wherein the second substrate is configured to control a direction of light output through the light guide channel, each of the at least one light guide channel corresponds to at least one light-emitting unit, each of the at least one light guide channel comprises a first opening and a second opening opposite to the first opening, and an area of a section of the second opening is greater than an area of a section of the first opening;

wherein the first opening is located in the first substrate, and the second opening is located in the second substrate;

wherein a material of the first substrate comprises any of sapphire, silicon carbide, aluminum nitride and monocrystalline silicon with [111] crystal orientation; and a material of the second substrate comprises monocrystalline silicon with [100] crystal orientation or monocrystalline silicon with [110] crystal orientation;

wherein the light guide channel comprises a first channel located in the first substrate and a light diffusion channel located in the second substrate.

16. The method of claim 15, wherein etching the substrate to form at least one light guide channel penetrated through the first substrate and the second substrate comprises:

etching the second substrate to form the light diffusion channel in the second substrate, wherein the light diffusion channel comprises a first side, a second side opposite to the first side, a third side and a fourth side opposite to the third side, a distance between the first side and the second side gradually increases in a first direction, and a distance between the third side and the fourth side gradually increases in the first direction, wherein the first direction is a direction from the first opening to the second opening, and the first side, the second side, the third side and the fourth side all have [111] crystal orientation; and etching the first substrate to form the first channel penetrated through the first substrate, so as to form the light guide channel by the first channel and the light diffusion channel.

17. The method of claim 15, wherein etching the substrate to form at least one light guide channel penetrated through the first substrate and the second substrate comprises:

etching the second substrate to form the light diffusion channel in the second substrate, wherein the light diffusion channel comprises a fifth side, a sixth side opposite to the fifth side, a seventh side and an eighth side opposite to the seventh side, the fifth side and the sixth side are parallel to each other, and a distance between the seventh side and the eighth side gradually increases in a first direction, wherein the first direction is a direction from the first opening to the second opening, and the fifth side, the sixth side, the seventh side and the eighth side all have [111] crystal orientation; and etching the first substrate to form the first channel penetrated through the first substrate, so as to form the light guide channel by the first channel and the light diffusion channel.

18. The method of claim 15, wherein forming the light-emitting structure on the substrate comprises:

sequentially growing a first semiconductor layer, an active layer and a second semiconductor layer on the first substrate; and forming a first electrode and a second electrode, such that the first semiconductor layer is electrically connected to a driving substrate through the first electrode, and the second semiconductor layer is electrically connected to the driving substrate through the second electrode.

19. The method of claim 15, further comprising: forming a wavelength conversion medium layer in the light guide channel, wherein the wavelength conversion medium layer comprises quantum dots or phosphor.

* * * * *